United States Patent
Kong et al.

(10) Patent No.: US 11,769,783 B2
(45) Date of Patent: Sep. 26, 2023

(54) THIN FILM TRANSISTOR ARRAY SUBSTRATE FOR DIGITAL X-RAY DETECTOR DEVICE AND DIGITAL X-RAY DETECTOR DEVICE AND MANUFACTURING METHOD THEREOF

(71) Applicant: LG Display Co., Ltd., Seoul (KR)

(72) Inventors: Minsuk Kong, Gyeongsangbuk-do (KR); Moonsoo Kang, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 90 days.

(21) Appl. No.: 17/112,449

(22) Filed: Dec. 4, 2020

(65) Prior Publication Data
US 2021/0183939 A1 Jun. 17, 2021

(30) Foreign Application Priority Data
Dec. 13, 2019 (KR) ........................ 10-2019-0166692

(51) Int. Cl.
*H01L 27/146* (2006.01)
*H01L 31/105* (2006.01)

(52) U.S. Cl.
CPC .... *H01L 27/14663* (2013.01); *H01L 27/1462* (2013.01); *H01L 31/105* (2013.01)

(58) Field of Classification Search
CPC ........... H01L 27/14663; H01L 27/1462; H01L 27/14609; H01L 27/14603; H01L 27/14692; H01L 27/14658; H01L 27/14676; H01L 31/105; H01L 31/115; H01L 31/085; H01L 23/60; G01T 1/2018; G01T 1/24
See application file for complete search history.

(56) References Cited

U.S. PATENT DOCUMENTS

2003/0201396 A1* 10/2003 Lee ................... H01L 27/14658
250/370.09
2006/0261401 A1* 11/2006 Bhattacharyya ....... B82Y 10/00
438/266

(Continued)

FOREIGN PATENT DOCUMENTS

CA 2992575 C * 12/2019 ........... A61B 6/4233
KR 10-2019-0062772 A 6/2019

OTHER PUBLICATIONS

Dong et. al. "Germanium-tin on Silicon p-i-n photodiode with low dark current due to sidewall surface passivation", 2015 Optical Fiber Communications Conference and Exhibition (OFC), Mar. 22-26, 2015, IEEE (Year: 2015).*

*Primary Examiner* — Sitaramarao S Yechuri
(74) *Attorney, Agent, or Firm* — POLSINELLI PC

(57) ABSTRACT

A thin film transistor array substrate for a digital X-ray detector device includes a base substrate; a driving thin film transistor disposed over the base substrate; a PIN (P type semiconductor-Intrinsic type semiconductor-N type semiconductor) diode configured to be connected to the driving thin film transistor, the PIN diode including a lower electrode, a PIN layer, and an upper electrode; and at least one leakage current blocking layer configured to cover a side surface of the PIN layer and contact the PIN layer to thereby minimize generation of the leakage current of the PIN diode and improve characteristics such as detective quantum efficiency (DQE) and signal to noise ratio (SNR) and improving an image quality of the digital X-ray detector device.

17 Claims, 13 Drawing Sheets

(56) References Cited

U.S. PATENT DOCUMENTS

| | | | |
|---|---|---|---|
| 2009/0152563 A1* | 6/2009 | Hayashi | H01L 27/14609 438/73 |
| 2009/0236496 A1* | 9/2009 | Tanada | H01L 31/101 250/206 |
| 2012/0018627 A1* | 1/2012 | Tredwell | H04N 5/357 378/207 |
| 2012/0061578 A1* | 3/2012 | Lim | H01L 27/14663 250/370.14 |

* cited by examiner

THIN FILM TRANSISTOR ARRAY SUBSTRATE FOR DIGITAL X-RAY DETECTOR DEVICE AND DIGITAL X-RAY DETECTOR DEVICE AND MANUFACTURING METHOD THEREOF

CROSS-REFERENCE TO RELATED APPLICATION

The present disclosure claims priority to and the benefit of Korean Patent Application No. 10-2019-0166692, filed on Dec. 13, 2019, which hereby incorporated by reference in its entirety.

BACKGROUND

Field of the Disclosure

The present disclosure relates to a thin film transistor array substrate for a digital X-ray detector device and the digital X-ray detector device that can minimize leakage current of a PIN (P type semiconductor-Intrinsic type semiconductor-N type semiconductor) diode, and a manufacturing method thereof.

Description of the Background

Because X-ray is of a short wavelength, the X-ray may pass through an object easily. The transmittance of the X-ray depends on an inner density of the object. Therefore, an internal structure of the object may be observed by detecting an amount of the X-ray transmitted through the object.

One of X-ray based inspection methods used in a medical field is a film printing scheme. However, in the film printing scheme, to check a result, an image is shot, and then a film is printed. Thus, it takes a long time to check the result. Especially, in the film printing scheme, there are some difficulties in storing and preserving the printed film.

A digital X-ray detector (DXD) device using a thin film transistor has been developed and widely used in the medical field.

The DXD device detects the transmittance of the X-ray transmitted through the object and displays an internal state of the object on a display based on the transmittance.

Therefore, the digital X-ray detector device may display the internal structure of the object without using an additional film and printed paper. Further, the DXD device may check the results in real time immediately after X-ray photographing.

SUMMARY

A digital X-ray detector device detects current inside a digital X-ray detection panel to implement an image based on the current and includes a scintillator layer that converts X-ray into a light, a photo PIN (P type semiconductor-Intrinsic type semiconductor-N type semiconductor) diode that responds to the light and various types of elements such as a driving thin film transistor that drives the photo PIN diode.

The scintillator layer converts X-ray irradiated to the digital X-ray detector device into a visible light. The PIN layer of the PIN diode converts the visible light into the electronic signal.

In some examples, an electronic signal converted by the PIN diode is transmitted to a readout circuitry through a readout line.

In this case, current may leak through a side surface of the PIN layer. A detection power of the readout line is degraded by the generated leakage current, which results in degradation of an image quality of the digital X-ray detector device.

Accordingly, the inventors of the present disclosure have invented a thin film transistor array substrate for a digital X-ray detector device and the digital X-ray detector device capable of minimizing leakage current of a PIN diode, and a manufacturing method thereof.

The present disclosure provides a thin film transistor array substrate for an X-ray detector device and the digital X-ray detector device capable of minimizing generation of the leakage current, and the manufacturing method thereof.

The present disclosure also provides a thin film transistor array substrate for an X-ray detector device and the digital X-ray detector device capable of improving the performance of the digital X-ray detector device by improving a detection power of the readout line, and a manufacturing method thereof.

The objects of the present disclosure are not limited to the above-mentioned objects, and the other objects and advantages of the present disclosure, which are not mentioned, may be understood by the following description, and more clearly understood by the aspects of the present disclosure. It is also readily understood that the objects and the advantages of the present disclosure may be implemented by features described in appended claims and a combination thereof.

According to an aspect of the present disclosure, there are provided a thin film transistor array substrate for an X-ray detector device and the digital X-ray detector device capable of minimizing generation of leakage current of a PIN diode and improving the detection power of the readout line, and a manufacturing method thereof.

According to an aspect of the present disclosure, a thin film transistor array substrate for a digital X-ray detector device and the digital X-ray detector device include a base substrate, a driving thin film transistor disposed above the base substrate, a PIN diode configured to be connected to the driving thin film transistor, the PIN diode including a lower electrode, a PIN layer, and an upper electrode, and at least one leakage current blocking layer configured to cover a side surface of the PIN layer and contact the PIN layer.

In this case, the plurality of leakage current blocking layers may be spaced apart from one another and the leakage current blocking layer may be disposed along a side circumference of the PIN layer.

The leakage current blocking layer may also contact the lower electrode, but may not contact the upper electrode.

The leakage current blocking layer may be made of metal and may be made of different material from that of the upper electrode. A first side of the leakage current blocking layer may contact the PIN layer and a second side of the leakage current blocking layer may contact an insulating layer.

In addition, according to an aspect of the present disclosure, a method for manufacturing a thin film transistor array substrate for a digital X-ray detector device includes forming a driving thin film transistor above a base substrate, forming a lower electrode electrically connected to the driving thin film transistor, forming a PIN layer and an upper electrode on or above the lower electrode, forming a leakage current blocking layer configured to contact the PIN layer and cover the side of the PIN layer, and forming a bias electrode on the upper electrode.

According to the present disclosure, the leakage current blocking layer is formed to contact and cover the side surface of the PIN layer of the PIN diode to block contact between the PIN layer and the insulating layer for minimizing the generation of the leakage current of the PIN diode.

In addition, according to the present disclosure, the generation of the leakage current of the PIN diode may be minimized to improve the detection power of the readout line. Therefore, characteristics such as detective quantum efficiency (DQE) and signal to noise ratio (SNR) may be improved, and thus, performance such as image quality of the digital X-ray detector device may be improved.

Specific effects of the present disclosure, in addition to the above-mentioned effects, will be described together while describing specific matters to implement the present disclosure.

BRIEF DESCRIPTION OF THE DRAWINGS

The accompanying drawings, which are included to provide a further understanding of the disclosure and are incorporated in and constitute a part of the present disclosure, illustrate aspect(s) of the disclosure and together with the description serve to explain the principle of the disclosure.

In the drawings.

DETAILED DESCRIPTION

Figure 1:
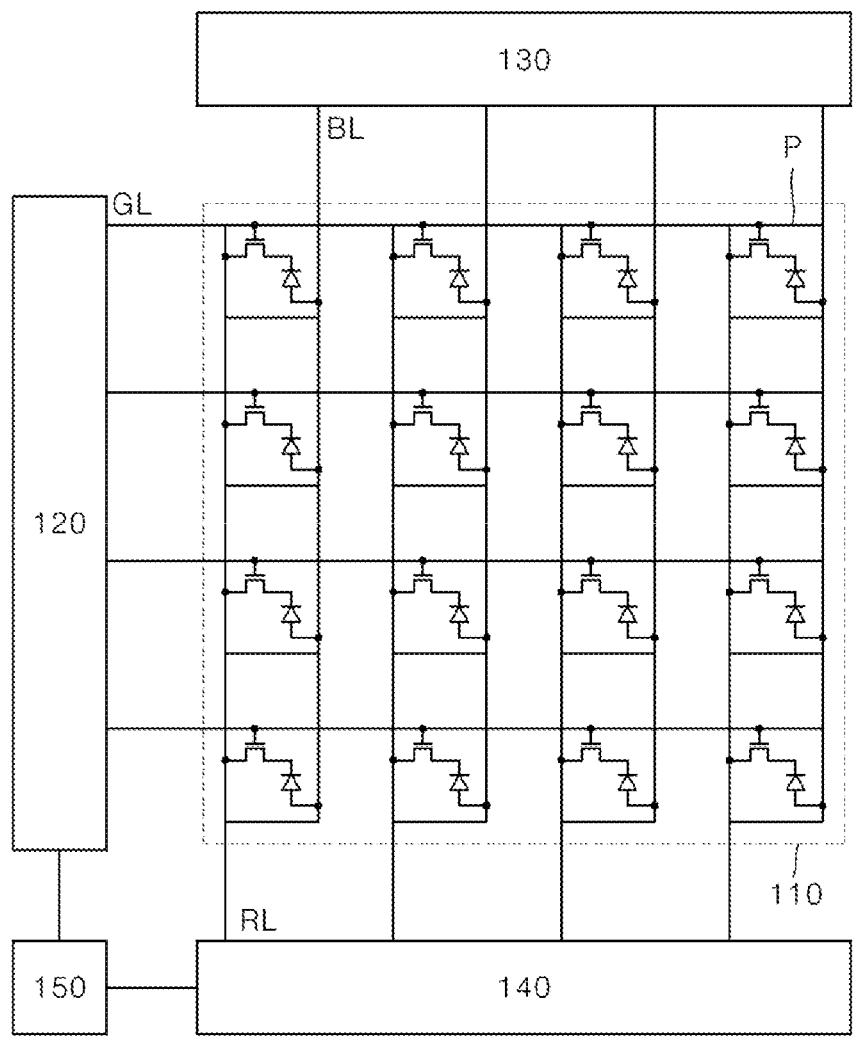
FIG. 1 is a schematic block diagram showing an example digital X-ray detector device.

Some aspects of the present disclosure are described in detail with reference to the accompanying drawings. Accordingly, the skilled person in the art to which the present disclosure pertains may easily implement the technical idea of the present disclosure. In the description of the present disclosure, if it is determined that a detailed description of a well-known technology relating to the present disclosure may be omitted if it unnecessarily obscures the gist of the present disclosure. One or more aspects of the present disclosure are described in detail with reference to the accompanying drawings. In the drawings, same reference numerals may be used to refer to same or similar components.

In this document, the terms "upper," "lower," "on," "under," or the like are used such that, where a first component is arranged at "an upper portion" or "a lower portion" of a second component, the first component may be arranged in contact with the upper surface (or the lower surface) of the second component, or another component may be disposed between the first component and the second component. Similarly, where a first component is arranged on or under a second component, the first component may be arranged directly on or under (in contact with) the second component, or one or more other components may be disposed between the first component and the second component.

Further, the terms "connected," "coupled," or the like are used such that, where a first component is connected or coupled to a second component, the first component may be directly connected or able to be connected to the second component, or one or more additional components may be disposed between the first and second components, or the first and second components may be connected or coupled through one or more additional components.

Hereinafter, a thin film transistor array substrate for a digital X-ray detector device according to some aspects of the present disclosure and the digital X-ray detector device including the same are described.

FIG. 1 is a schematic block diagram showing a digital X-ray detector device. The digital X-ray detector device may include a thin film transistor array 110, a gate driver 120, a bias supply 130, a readout integrated circuit (IC) 140, and a timing controller 150.

The thin film transistor array 110 may include a plurality of cell regions defined by a plurality of gate lines GL arranged in a first direction and by a plurality of readout lines RL arranged in a second direction orthogonal to the first direction.

The cell regions are arranged in a matrix configuration. Each cell region may include a pixel region in which photo-sensitive pixels Ps are formed. The thin film transistor array 110 may detect the X-ray emitted from an X-ray source, may convert the detected X-ray into an electrical signal, and may output the electrical signal.

Each photo-sensitive pixel may include a PIN (P type semiconductor-Intrinsic type semiconductor-N type semiconductor) diode which converts light of a visible light region converted from the X-ray by a scintillator into an electronic signal and outputs the electronic signal and a thin film transistor TFT that transmits a detected signal output from the PIN diode to a readout circuitry 140. A first end of the PIN diode may be connected to the thin film transistor and a second end thereof may be connected to a bias line BL.

A gate electrode of the thin film transistor may be connected to the gate line GL which carries a scan signal. Source and drain electrodes of the thin film transistor may be respectively connected to the PIN diode and a readout line RL which carries the detected signal output from the PIN diode. Each bias line BL may extend in a parallel manner to each readout line RL.

The gate driver 120 may sequentially apply gate signals to thin film transistors of photo-sensitive pixels through the gate lines GLs. The thin film transistors of the photo-sensitive pixels may be turned on in response to the gate signals having a gate-on voltage level.

The bias supply 130 may apply driving voltages to the photo-sensitive pixels through the bias lines BL. The bias supply 130 may selectively apply a reverse bias or a forward bias to the PIN diode.

The readout circuitry 140 may read out the detected signal received from the thin film transistor turned on in response to the gate signal of the gate driver. For example, the detected signal output from the PIN diode may be input to the readout circuitry 140 through the thin film transistor and the readout line RL.

The readout circuitry 140 may have an offset readout period for which an offset image is read out and an X-ray readout period for which the detected signal after an X-ray exposure is read out and may read out the detection signal output from the photo-sensitive pixels during the X-ray readout period.

The readout circuitry 140 may include a signal detector and a multiplexer. The signal detector includes a plurality of amplification circuits that correspond respectively to the readout lines RL. Each amplification circuit may include an amplifier, a capacitor, and a reset element.

The timing controller 150 may control an operation of the gate driver 120 by generating a start signal and a clock signal and supplying each of the start signal and the clock signal to the gate driver 120. Further, the timing controller 150 may control an operation of the readout circuitry 140 by generating a readout control signal and a readout clock signal and supplying each of the readout control signal and the readout clock signal to the readout circuitry 140.

Hereinafter, a thin film transistor substrate for a digital X-ray detector device according to one aspect of the present disclosure and the digital X-ray detector device including the same are described in detail with reference to FIG. 2 to FIG. 5.

A digital X-ray detector device 200 according to one aspect of the present disclosure includes a base substrate 210.

The base substrate 210 may be embodied as a glass substrate made of glass, but is not limited thereto. In some cases where the base substrate 210 is used for a flexible digital X-ray detector device, a substrate made of polyimide material and having flexible properties may be used as an example of the base substrate 210.

On the base substrate 210, a plurality of cell regions are defined by a plurality of gate lines 223 and a plurality of readout lines 225 intersecting with one another in an orthogonal manner. Each pixel may correspond to each cell region to define a plurality of pixel regions. A region corresponding to the gate line 223 and the readout line 225 may be defined as a boundary region between pixel regions.

Each pixel includes the thin film transistor 220 and the PIN diode 230. The plurality of thin film transistors 220 and the plurality of PIN diodes 230 may be disposed on an array substrate having the plurality of pixel regions. The thin film transistor 220 and the PIN diode 230 of the pixel are described below and this configuration may also be applied to adjacent pixels unless otherwise specified.

A thin film transistor 220 including a first electrode 225a, a second electrode 225b, a gate electrode 223a, and an active layer 221 is disposed on or above the base substrate 210.

A buffer layer 211 may be disposed between the base substrate 210 and the thin film transistor 220. In this case, the buffer layer 211 may be made of an inorganic material such as silicon oxide (SiOx) or silicon nitride (SiNx) and may be provided as a multi-buffer layer composed of multiple sub-layers.

The active layer 221 may be disposed above the base substrate 210. The active layer 221 may be made of an oxide semiconductor material such as indium gallium zinc oxide (IGZO), but is not limited thereto, and may be made of low temperature polycrystalline silicon (LTPS) or amorphous silicon (a-Si).

The active layer 221 may include, for example, a channel region and conducting regions, where the channel region is disposed between two conducting regions. In some examples, the conducting regions may be divided into a first conducting region connected in direct contact with a first electrode 225a and a second conducting region connected in direct contact with a second electrode 225b.

The conducting regions of the active layer 221 may be formed by conducting both ends of the active layer 221 and various types of methods such as a dry etching method, a hydrogen plasma treatment, a helium plasma treatment, and the like may be used as examples of a conducting treatment method.

A gate electrode 223a is disposed above the active layer 221 and a gate insulating layer 222 is disposed between the active layer 221 and the gate electrode 223a to insulate the active layer 221 from the gate electrode 223a.

For example, the gate electrode 223a may be disposed on the gate insulating layer 222 to correspond to the channel region of the active layer 221. The gate electrode 223a may be made of one selected from a group consisting of molybdenum (Mo), aluminum (Al), chromium (Cr), gold (Au), titanium (Ti), nickel (Ni), copper (Cu) and alloys thereof and may include a single layer or multiple layers.

The gate electrode 223a may extend from a gate line 223. The gate line 223 and the gate electrode 223a may be integrated with one another such that the gate electrode 223a is disposed in the gate line 223. Accordingly, the gate line 223 and the gate electrode 223a may be disposed on the same layer.

The gate insulating layer 222 made of an inorganic material is disposed under the gate electrode 223a and may have the same or greater area than that of the gate electrode 223a for effective insulation.

The gate electrode 223a and the gate insulating layer 222 may each be disposed at a central region of the active layer 221. In this example, a first area of the active layer 221 exposed without being overlaid by the gate electrode 223a, for example, a first end of the active layer 221 other than the channel region may be a first conducting region and a second area of the active layer 221 exposed by not being overlaid by the gate electrode 223a, for example, a second end of the active layer 221 other than the channel region may be a second conducting region.

In this case, the first conducting region may be a drain region and the second conducting region may be a source region.

The source region of the active layer 221 may be disposed closer to the PIN diode 230 than the drain region, but is not limited thereto, and the positions of the source region and the drain region may be interchanged.

An interlayer insulating layer 224 made of an inorganic material may be disposed on the gate electrode 223a to overlay the base substrate 210. The first electrode 225a and the second electrode 225b may each be disposed on the interlayer insulting layer 224.

The first electrode 225a may be disposed at a first side of the active layer 221 and the second electrode 225b may be disposed at the second side of the active layer 221. Accordingly, the gate electrode 223a may be disposed between the first electrode 225a and the second electrode 225b. A first contact hole 224a may be provided in the interlayer insulating layer 224 at an area in which the active layer 221 overlaps with the first electrode 225a and a second contact hole 224b may be provided in the interlayer insulating layer 224 at an area in which the active layer 221 overlaps with the second electrode 225b.

In some examples, the first contact hole 224a may be provided on the drain region of the active layer 221 and the second contact hole 224b may be provided on the source region of the active layer 221. Accordingly, the first electrode 225a is connected to the drain region of the active layer 221 through the first contact hole 224a and the second electrode 225b may be connected to the source region of the active layer 221 through the second contact hole 224b.

Accordingly, the first electrode 225a connected to the drain region may be a drain electrode and the second electrode 225b connected to the source region may be a source electrode.

The first electrode 225a and the second electrode 225b may each extend from the readout line 225 and may each be disposed on the same layer as the readout line 225.

The readout line 225 may be made of, but is not limited to, one selected from a group consisting of molybdenum (Mo), aluminum (Al), chromium (Cr), gold (Au), titanium (Ti), nickel (Ni), copper (Cu) and alloys thereof.

A first passivation layer 226 may be disposed on or above the thin film transistor 220 to overlay a whole surface of the base substrate. The first passivation layer 226 may be made of an inorganic material such as silicon oxide (SiOx) or silicon nitride (SiNx), but is not limited thereto. The first passivation layer 226 may protect the thin film transistor 220, for example, the active layer 221.

The PIN diode 230 is disposed on the first passivation layer 226 to be connected to the thin film transistor 220. The PIN diode 230 may be disposed in the pixel region.

The PIN diode 230 may include a lower electrode 231 connected to the thin film transistor 220, a PIN layer 232 on the lower electrode 231, and an upper electrode 233 on the PIN layer 232.

The lower electrode 231 may serve as a pixel electrode in the PIN diode 230. The lower electrode 231 may be made of an opaque metal such as molybdenum Mo or at least one of transparent oxides such as indium tin oxide (ITO), indium zinc oxide (IZO), and zinc oxide (ZnO), depending on characteristics of the PIN diode 230.

The lower electrode 231 may be connected to the second electrode 225b of the thin film transistor 220 via a third contact hole 226a as a contact hole in the first passivation layer 226, such that the thin film transistor 220 may be connected to the PIN diode 230.

The PIN layer 232 may be disposed on the lower electrode 231 to convert a visible light, which has been converted from the X-ray, into an electrical signal. In this connection, a scintillator may convert the X-ray into the visible light.

The PIN layer 232 may be formed by sequentially stacking, on the lower electrode 231, an N (Negative) type semiconductor layer 232n containing N type impurities, an I (Intrinsic) type semiconductor layer 232i, and a P (Positive) type semiconductor layer 232p containing P type impurities.

The I-type semiconductor layer may be relatively thicker than each of the N-type semiconductor layer and the P-type semiconductor layer. The PIN layer 232 may be made of a material capable of converting the visible light into which the X-ray emitted from an X-ray source is converted into an electrical signal, for example, a-Se, $HgI_2$, CdTe, PbO, $PbI_2$, $BiI_3$, GaAs, and Ge.

The upper electrode 233 may be disposed on the PIN layer 232. The upper electrode 233 may be made of at least one of transparent oxides such as indium tin oxide (ITO), indium zinc oxide (IZO), and zinc oxide (ZnO) and may improve a fill factor of the PIN diode 230.

At least one leakage current blocking layer 236 is disposed at a side surface of the PIN layer 232 and contacts the PIN layer 232 to cover the side surface of the PIN layer 232.

In some examples, the leakage current blocking layer 236 directly contacts and covers the intrinsic semiconductor layer 232i of the PIN layer 232 to minimize direct contact between the intrinsic semiconductor layer 232i of the PIN layer 232 and an insulating layer such as the passivation layer, thereby minimizing generation of the leakage current escaping through the insulating layer from the side surface of the PIN layer 232.

Figure 2:
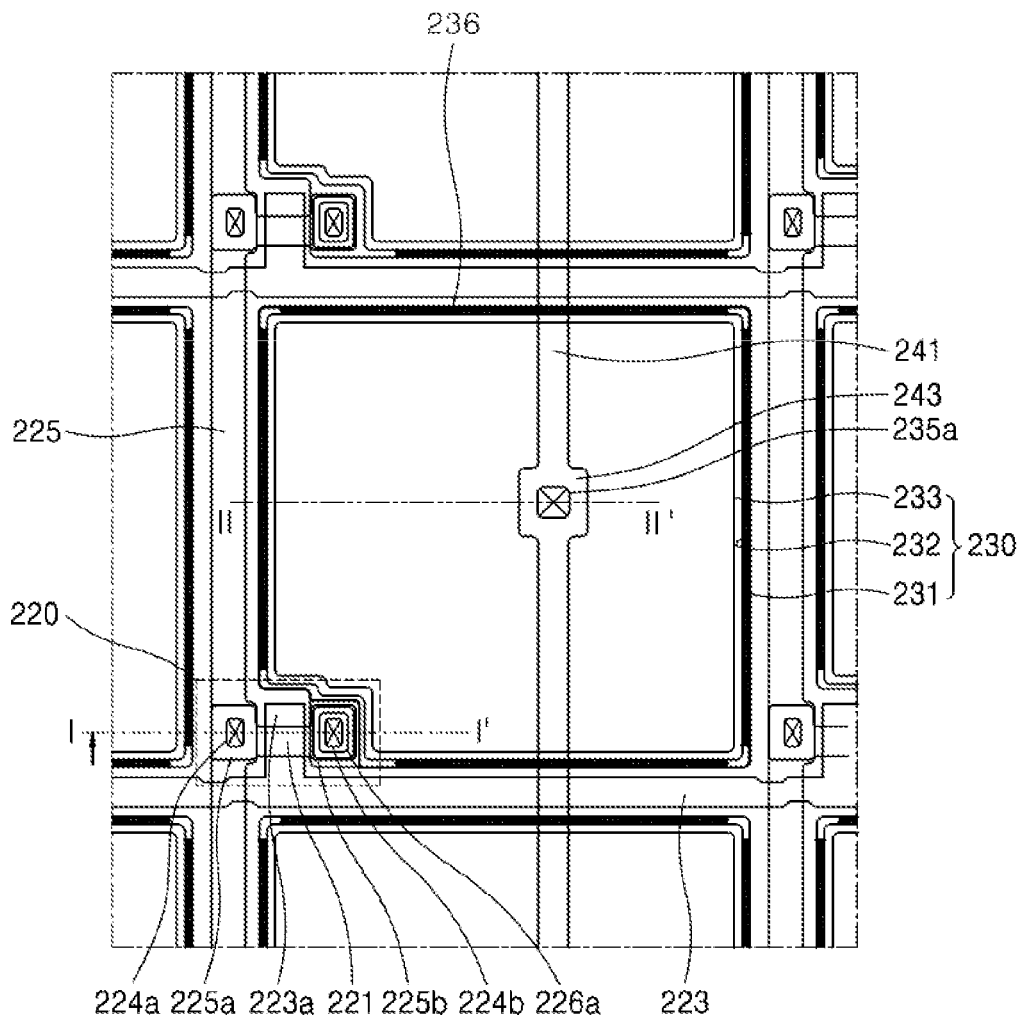
FIG. 2 is a plan view showing an example area of a digital X-ray detector device.

According to an aspect of the present disclosure, as shown in FIG. 2, a plurality of leakage current blocking layers 236 may be provided and may be spaced apart from one another.

For example, the leakage current blocking layer 236 may not surround an entire periphery of the PIN layer 232. Specifically, the leakage current blocking layer 236 is not disposed at corners of the PIN layer 232 and may be disposed to cover side surfaces of the PIN layer 232 except for corners. For example, the leakage current blocking layers 236 may cover four side surfaces having a greatest area, among the plurality of side surfaces except for the corners and may be spaced apart from one another.

When the leakage current blocking layer 236 covers the corner of the PIN layer 232, an additional process using a halftone mask may be used. Therefore, the leakage current blocking layer 236 may not be disposed at the corner of the PIN layer 232 for process efficiency.

Figure 3:
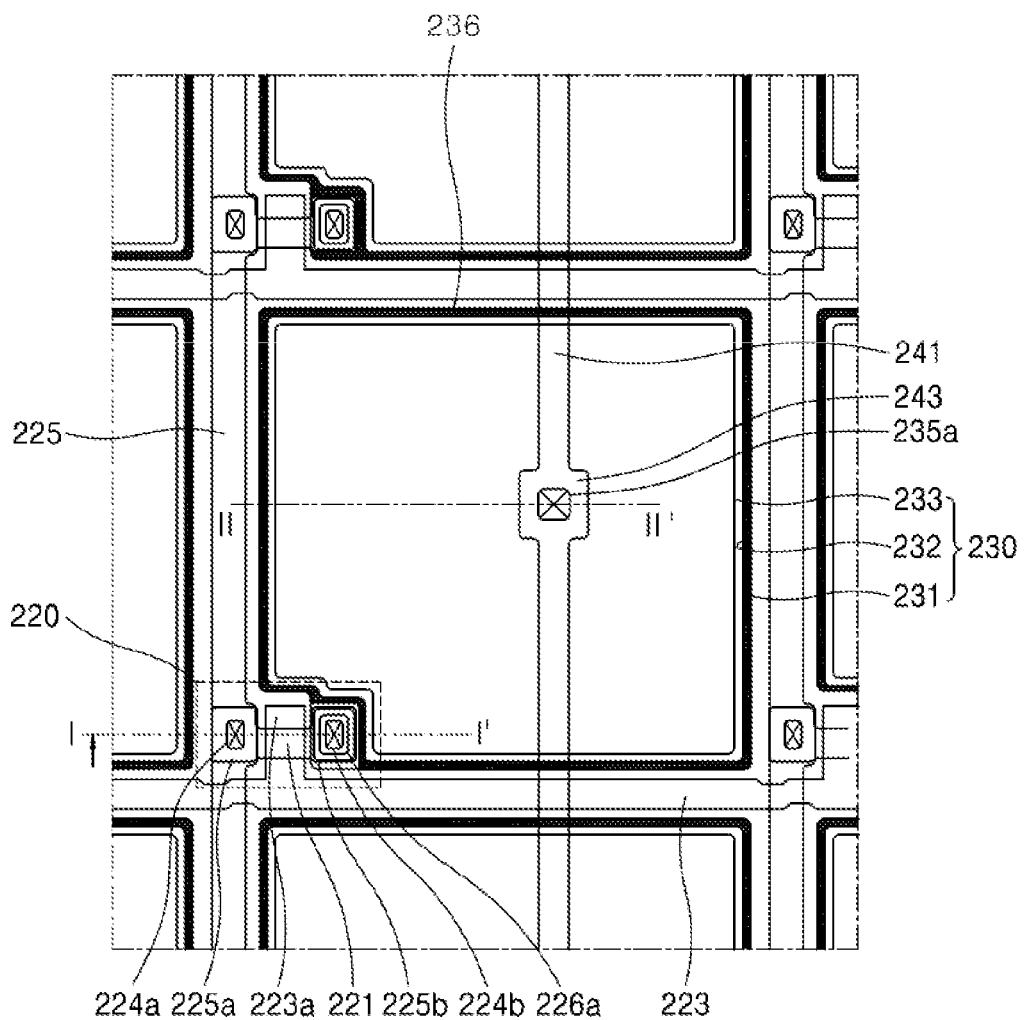
FIG. 3 is a plan view showing an example area of a digital X-ray detector device.

According to another aspect of the present disclosure, as shown in FIG. 3, a plurality of leakage current blocking layers 236 that are spaced apart from one another are not provided and the leakage current blocking layer 236 may be disposed along a periphery of a side of the PIN layer 232.

For example, the leakage current blocking layer 236 is disposed along the side circumference of the PIN layer 232 to provide no side area exposed outside. Therefore, a contact area between the PIN layer 232 and an insulating layer is minimized and the generation of the leakage current escaping through the insulating layer from the side surface of the PIN layer 232 may be minimized.

Figure 4:
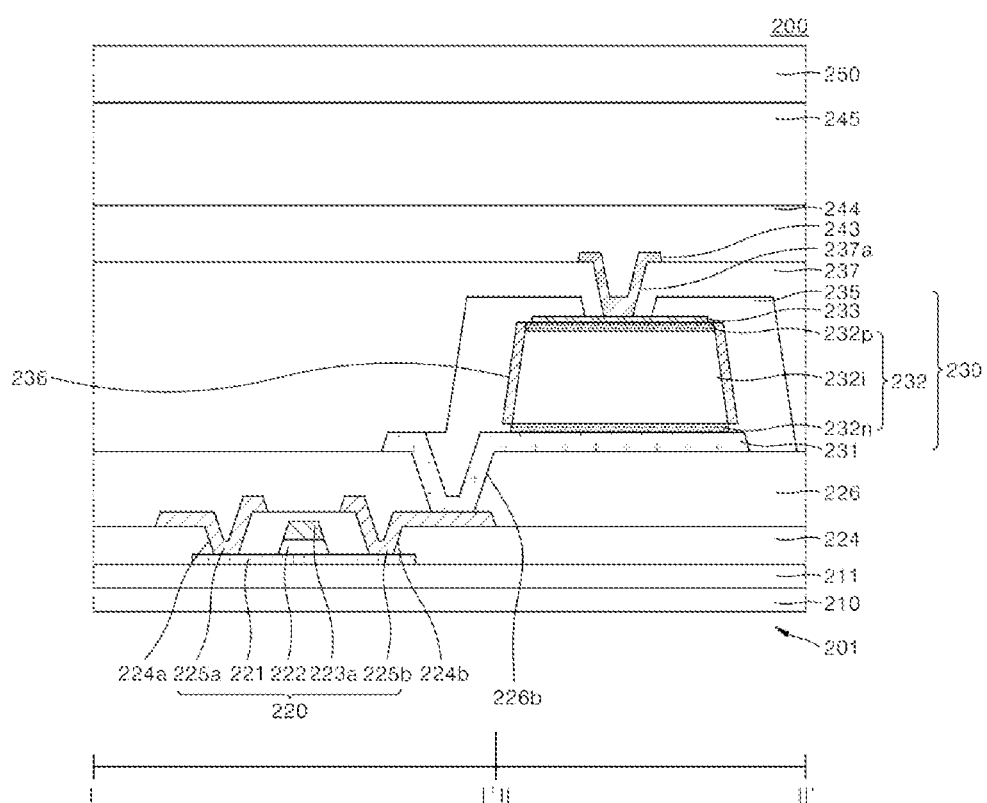
FIG. 4 is a cross-sectional view showing an example area taken along line I-I' of a digital X-ray detector device.

As shown in FIG. 4, according to an aspect of the present disclosure, the leakage current blocking layer 236 may contact the PIN layer 232, but may not contact the lower electrode 231.

In this case, the leakage current blocking layer 236 may cover the intrinsic semiconductor layer 232i of the PIN layer 232, but may not cover at least a portion of the n-type semiconductor layer 232n and is spaced apart from a lower electrode 231 by a predetermined distance and may not contact the lower electrode 231.

As the leakage current is generated through the intrinsic semiconductor layer 232i of the PIN layer 232, even when the leakage current blocking layer 236 covers the side surface of the intrinsic semiconductor layer 232i that does not directly contact the lower electrode 231, the leakage current may be effectively reduced.

In addition, the leakage current blocking layer 236 is spaced apart from the lower electrode 231 in consideration of the process margin to prevent contact between the leakage current blocking layer 236 and the lower electrode 231 and contact between the leakage current blocking layer 236 and the upper electrode 233, thereby minimizing malfunction of the PIN diode 230.

Figure 5:
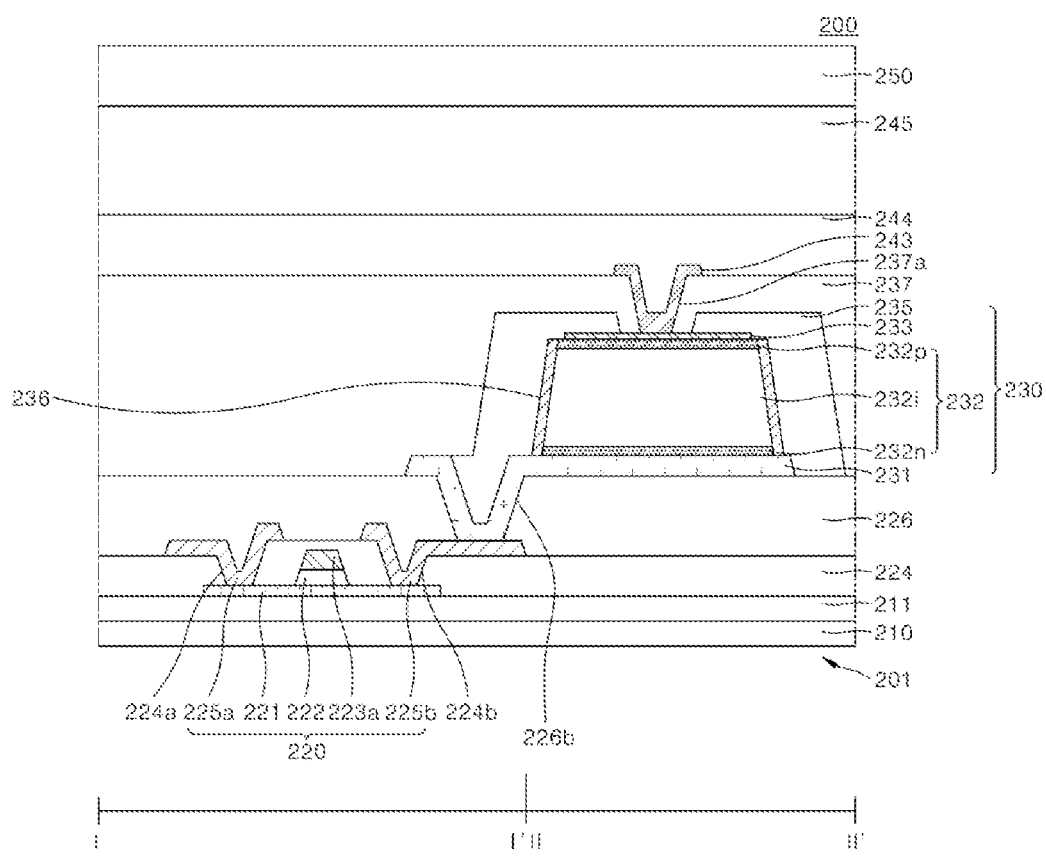
FIG. 5 is a cross-sectional view showing an example area taken along line I-I' of a digital X-ray detector device.

According to another aspect of the present disclosure, as shown in FIG. 5, a leakage current blocking layer 236 may contact a lower electrode 231.

The leakage current blocking layer 236 contacts the lower electrode 231 to minimize the exposed area at the side surface of the PIN layer 232 to thereby minimize the leakage current escaping to the insulating layer from the side surface of the PIN layer 232.

In particular, most of the leakage current generated in the PIN layer 232 is discharged toward the lower electrode 231 from the upper electrode 233. The leakage current blocking layer 236 contacts the lower electrode 231 to block the side surface of the PIN layer 232 by the leakage current blocking layer 236, thereby minimizing the generation of the leakage current.

The leakage current blocking layer 236 may not contact the upper electrode 233.

The leakage current blocking layer 236 contacts the upper electrode 233 to electrically connect the lower electrode 231 to the upper electrode 233. Therefore, the leakage current blocking layer 236 may be advantageous to be spaced apart from the upper electrode 233 to not contact the upper electrode 233.

The leakage current blocking layer 236 may be made of metal for effectively blocking the leakage current. In this case, the metal may include at least one of molybdenum titanium (MoTi), Cu, and ITO.

The leakage current blocking layer 236 is made of different material from that of the upper electrode 233 to minimize an influence caused by the contact between the leakage current blocking layer 236 and the upper electrode 233 due to a process margin deviation.

A first surface of the leakage current blocking layer 236 may directly contact the PIN layer 232 and a second surface of the leakage current blocking layer 236 may directly contact the insulating layer. As shown in FIGS. 4 and 5, the leakage current blocking layer 236 is disposed between the PIN layer 232 and the second passivation layer 235 to reduce a direct contact area between the side surface of the PIN layer 232 and the second passivation layer 235.

A second passivation layer 235 may be disposed in the PIN diode 230. The second passivation layer 235 may be made of an inorganic material such as silicon oxide (SiOx) or silicon nitride (SiNx), but is not limited thereto. The second passivation layer 235 may cover up to a side surface of the PIN diode 230 to protect the side surface of the PIN diode 230 from moisture or other foreign substances.

If the leakage current blocking layer 236 is not disposed at the side surface of the PIN layer 232, the side surface of the PIN layer 232 is exposed to outside. In this example, the insulating layer such as the second passivation layer 235 protects the side surface of the PIN layer 232 that are exposed to outside.

As the PIN layer 232 is a semiconductor layer made of silicon (Si), if the PIN layer 232 directly contacts the insulating layer such as the second passivation layer 235 made of silicon oxide (SiOx) or silicon nitride (SiNx) containing Si which is the same material as the PIN layer 232, the leakage current may be generated along the contact surface thereof.

Therefore, according to an aspect of the present disclosure, the leakage current blocking layer 236 made of metal not including silicon is disposed between the insulating layer and the PIN layer 232 and a first surface of the leakage current blocking layer 236 directly contacts the PIN layer 232 and a second surface of the leakage current blocking layer 236 directly contacts the insulating layer to block the contact between the PIN layer 232 made of the same material as the second passivation layer 235, for example, silicon and the insulating layer to thereby effectively block the leakage current.

A first planarization layer 237 may be disposed on the second passivation layer 235 to overlay a whole surface of the base substrate 210 including the PIN diode 230.

The first planarization layer 237 may be made of an organic material such as PAC (Photo Acryl), but is not limited thereto.

A bias electrode 243 may be disposed on the first planarization layer 237 on the PIN diode 230. The bias electrode 243 may be connected to the upper electrode 233 of the PIN diode 230 via a fourth contact hole 237a as a contact hole in the first planarization layer 237 and may apply a bias voltage to the PIN diode 230.

The bias electrode 243 may be branched from a bias line 241 arranged in parallel to the readout line 225.

A third passivation layer 244 made of inorganic material such as silicon oxide (SiOx) or silicon nitride (SiNx) may be disposed on the bias electrode 243.

A second planarization layer 245 may disposed on the third passivation layer 244 to overlay a whole surface of the base substrate 210.

The second planarization layer 245 may be made of an organic material such as photo acryl (PAC), but is not limited thereto.

A scintillator layer 250 may be disposed on the second planarization layer 245 to overlay the PIN diode 230 above the base substrate.

In some examples, the scintillator layer 250 is disposed above each of the thin film transistor 220 and the PIN diode 230 to overlay each of the thin film transistor 220 and the PIN diode 230.

As the scintillator layer 250 may be directly deposited on the array substrate 201, the planarization of a lower surface of the scintillator layer 250 may be needed. Therefore, the second planarization layer 245 is disposed to planarize the lower surface of the scintillator layer 250 to thereby facilitate the formation of the scintillator layer 250 by deposition of the scintillator.

The scintillator layer 250 may be grown in a vertical direction to have a plurality of columnar crystal phases, such that a plurality of scintillator columnar crystals may be arranged in a side-by-side manner, but is not limited thereto. The scintillator may be made of a material such as cesium iodide (CsI), but is not limited thereto.

The digital X-ray detector device 200 according to the present disclosure operates as follows.

X-ray is irradiated to the digital X-ray detector device 200. The scintillator layer 250 converts the X-ray into the visible light. The PIN layer 232 of the PIN diode 230 converts the light in the visible region into an electronic signal.

For example, when the light in the visible region is irradiated to the PIN layer 232, the I-type semiconductor layer 232i is depleted by each of the N-type semiconductor layer 232n and the P-type semiconductor layer 232p, thereby generating an electric field therein. Then, holes and electrons generated by the light drift based on the electric field and are collected into the P-type semiconductor layer and the N-type semiconductor layer, respectively.

The PIN diode 230 converts the light in the visible region into the electronic signal and transmits the electronic signal to the thin film transistor 220. The electronic signal thus transmitted is displayed as an image signal via the readout line 225 connected to the thin film transistor 220.

FIGS. 6A to 6F are process diagrams showing example methods for manufacturing a digital X-ray detector device.

According to an aspect of the present disclosure, the digital X-ray detector device comprises: i) forming a driving thin film transistor 220 above a base substrate 210, ii) forming a lower electrode 231 electrically connected to the driving thin film transistor 220, iii) forming a PIN layer 232 and an upper electrode 233 on or above the lower electrode 231, iv) forming a leakage current blocking layer 236 to contact the PIN layer 232 and cover a side surface of the PIN layer 232, and v) forming a bias electrode 243 on the upper electrode 233.

Figure 6A:
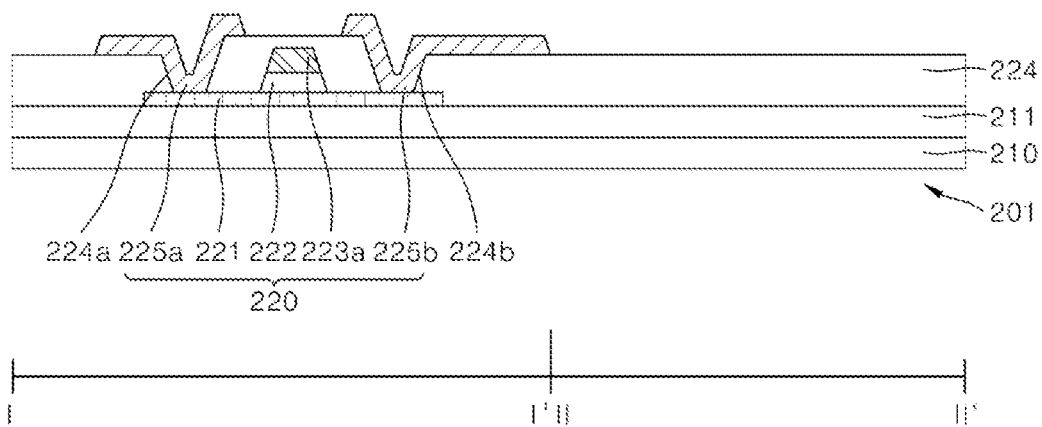
FIGS. 6A to 6F are process diagrams for example methods for manufacturing a digital X-ray detector device.

As shown in FIG. 6A, a buffer layer is formed above the base substrate 210 and the driving thin film transistor 220 including the active layer 221, the gate electrode 223a, the first electrode 225a, and the second electrode 225b is formed above the buffer layer.

The gate insulating layer 222 is formed between the active layer 221 and the gate electrode 223a and an interlayer insulating layer 224 is formed between the active layer 221 and the first electrode 225a and between the active layer 221 and the second electrode 225b. The first electrode 225a may be connected to the active layer 221 via a first contact hole 224a of the interlayer insulating layer 224 and the second electrode 225b may be connected to the active layer 221 via a second contact hole 224b of the interlayer insulating layer 224.

Figure 6B:
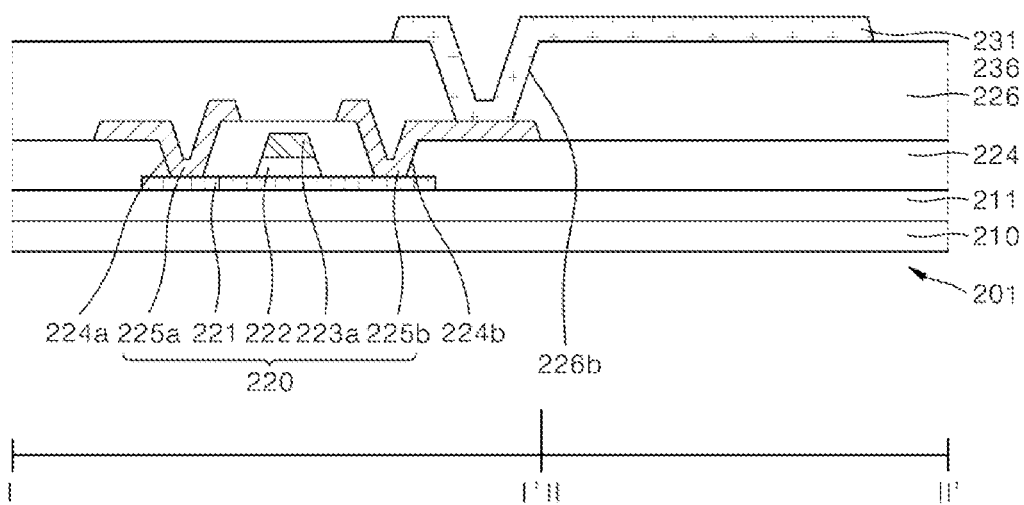

As shown in FIG. 6B, a first passivation layer 226 is formed to cover each of the first electrode 225a and the second electrode 225b and the lower electrode 231 of the PIN diode 230 is formed to be electrically connected to the second electrode 225b via a third contact hole 226a of the first passivation layer 226.

Figure 6C:
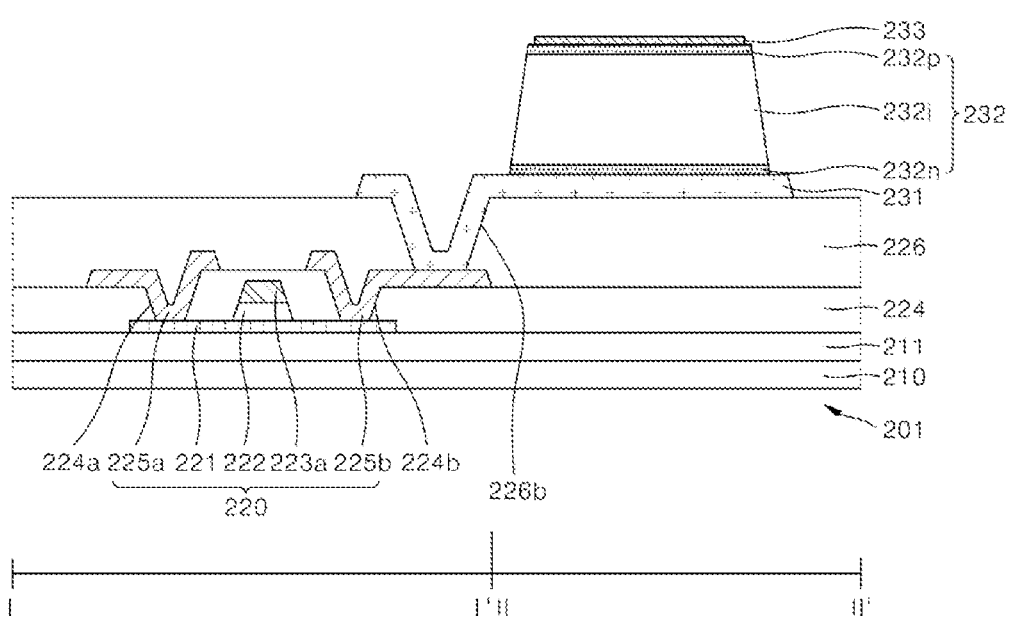

As shown in FIG. 6C, a PIN layer 232 including an N type semiconductor layer 232n, an intrinsic (I) type semiconductor layer 232i, and a p type semiconductor layer 232p and the upper electrode 232 are stacked on the lower electrode 230 of the PIN diode 230.

In this case, the PIN film and the upper electrode 233 film are each formed to overlay a whole surface of the base substrate 210 and the PIN layer 232 and the upper electrode 233 may each be formed by a patterning process using a mask.

Figure 6D:
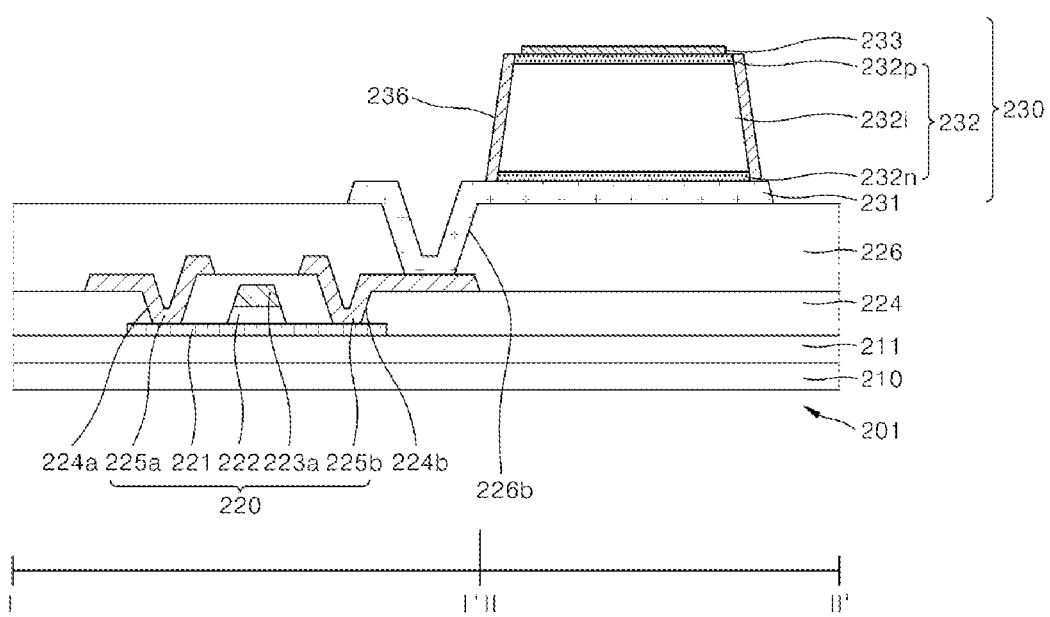

As shown in FIG. 6D, a leakage current blocking layer 236 is formed at a side surface of a PIN layer 232 to cover the side surface of the PIN layer 232 to thereby directly contact the PIN layer 232.

In this case, the leakage current blocking layers 236 may be spaced apart from one another as shown in FIG. 2, the leakage current blocking layer 236 may extend along a side circumference of the PIN layer 232 as shown in FIG. 3, the leakage current blocking layer 236 may not contact the lower electrode 231 as shown in FIG. 4, and the leakage current blocking layer 236 may contact the lower electrode 231 as shown in FIG. 5.

Figure 6E:
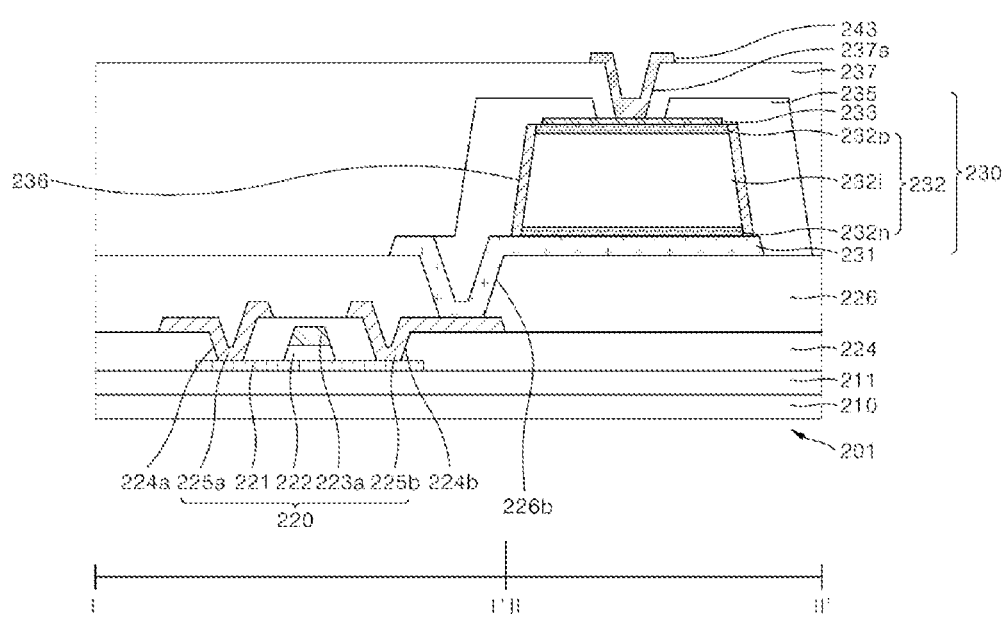

In addition, as shown in FIG. 6E, the second passivation layer 235 is formed to cover the PIN diode 230 and the leakage current blocking layer 236 and the first planarization layer 237 may be formed above a whole surface of the base substrate 210. A bias electrode 243 is formed on the upper electrode 233, for example, the first planarization layer 237 and the bias electrode 243 may be electrically connected to the upper electrode 233 of the PIN diode 230 via a fourth contact hole 237a of the first planarization layer 237.

Figure 6F:
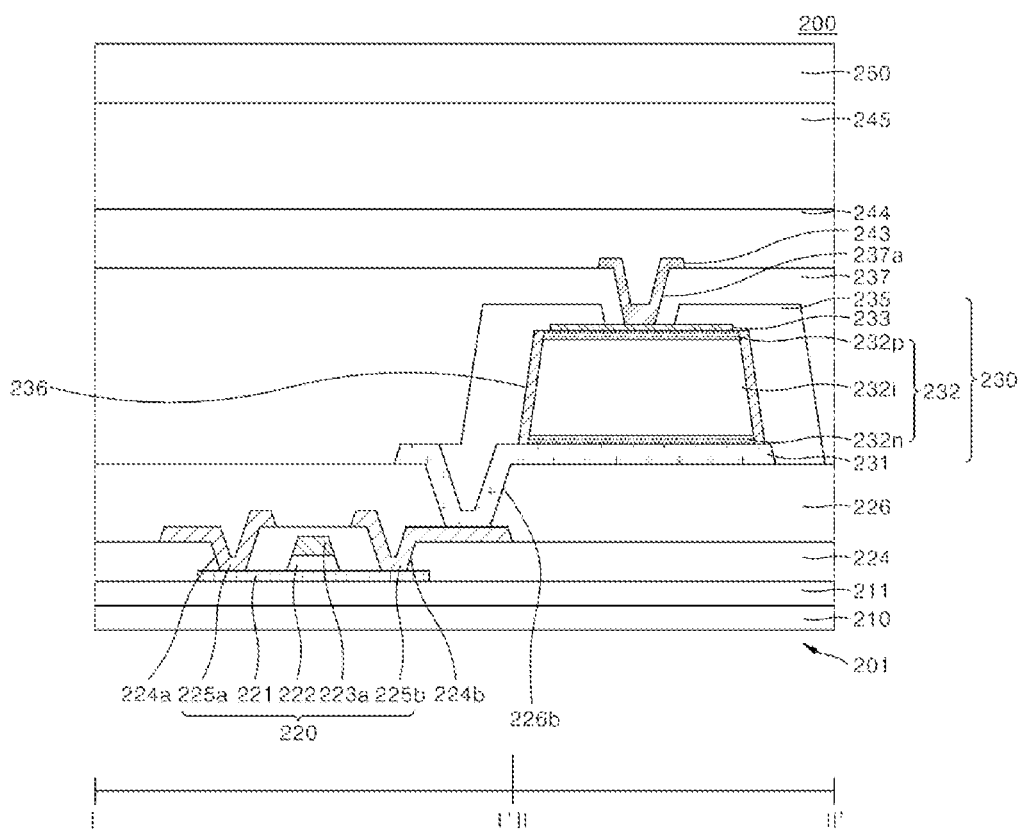

As shown in FIG. 6F, a third passivation layer 244 and a second planarization layer 245 are each formed and a scintillator layer 250 is formed on the second planarization layer 245 to form a digital X-ray detector device 200.

Figure 7A:
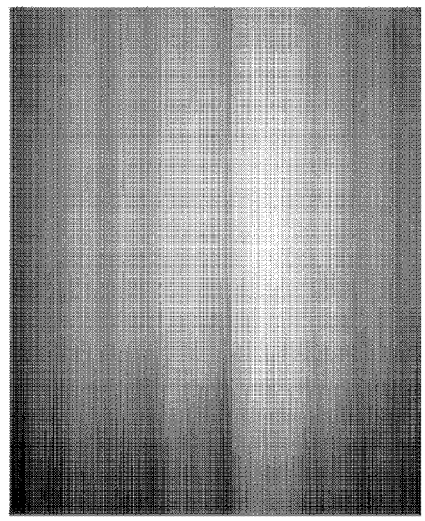
FIGS. 7A and 7B show X-ray images of leakage current measured in a comparative example without a leakage current blocking layer and an aspect with a leakage current blocking layer.
Figure 7B:
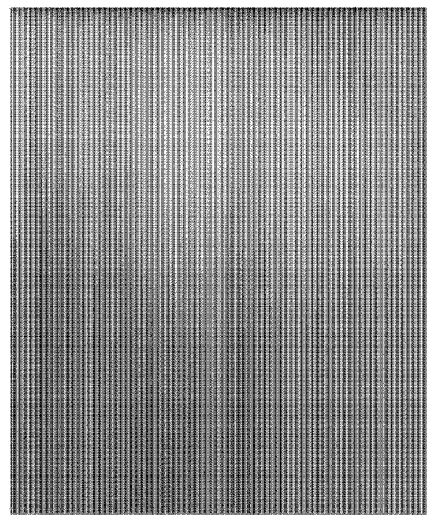

FIGS. 7A and 7B show X-ray images of leakage current measured in a comparative example without a leakage current blocking layer and an aspect with a leakage current blocking layer.

For example, the comparative example and the aspect differ from each other only in contact between the leakage current blocking layer and a side surface of a PIN layer and use the same digital X-ray detector device for other configurations. FIGS. 7A and 7B show dark images when a digital X-ray detector device is in an off state according to the comparative example and the aspect.

As shown in FIG. 7A, in the comparative example, lines of the X-ray image are not clearly determined, which results in generation of a large amount of leakage current.

As shown in FIG. 7B, in the aspect, lines of the X-ray image are clearly determined, which results in generation of little amount of leakage current.

According to an aspect of the present disclosure, a detection power of the readout line may be improved by minimizing the generation of the leakage current of the PIN diode.

As the detection power of the readout line is improved, characteristics such as detective quantum efficiency (DQE) and signal to noise ratio (SNR) may be improved, and thus, performance such as image quality of the digital X-ray detector device may be improved.

According to an aspect of the present disclosure, the thin film transistor array substrate for the digital X-ray detector device and the digital X-ray detector device includes a base substrate, a driving thin film transistor disposed above the base substrate, a PIN diode connected to the driving thin film transistor and including the lower electrode, the PIN layer, and the upper electrode, and at least one leakage current blocking layer to cover the side surface of the PIN layer and contact the PIN layer.

In this case, the plurality of leakage current blocking layers may be spaced apart from one another and the leakage current blocking layer may be disposed along the side circumference of the PIN layer.

In addition, the leakage current blocking layer may or may not contact the lower electrode, but may not contact the upper electrode.

The leakage current blocking layer may be made of metal and may be made of different material from that of the upper electrode. The first side of the leakage current blocking layer may contact the PIN layer and the second side of the leakage current blocking layer may contact the insulating layer.

In addition, according to an aspect of the present disclosure, the method for manufacturing the thin film transistor array substrate for the digital X-ray detector includes forming the driving thin film transistor above the base substrate, forming a lower electrode electrically connected to the driving thin film transistor, forming the PIN layer and the upper electrode on or above the lower electrode, forming the leakage current blocking layer to contact the PIN layer and cover the side surface of the PIN layer, and forming the bias electrode above the upper electrode.

Although the present disclosure has been described with reference to the exemplary drawings, the present disclosure is not limited to the aspects and the drawings disclosed herein, and various modifications can be made by those skilled in the art within the scope of the technical idea of the present disclosure. Further, even if working effects obtained based on configurations of the present disclosure are not explicitly described in the description of aspects of the present disclosure, effects predictable based on the corresponding configuration have to be recognized.

What is claimed is:

1. A thin film transistor array substrate for a digital X-ray detector device, comprising:
   a base substrate;
   a thin film transistor disposed over the base substrate;
   a PIN (P type semiconductor-Intrinsic type semiconductor-N type semiconductor) diode configured to be connected to the thin film transistor, the PIN diode including a lower electrode, a PIN layer, and an upper electrode; and a leakage current blocking layer configured to cover a side surface of the PIN layer and contact the PIN layer, wherein the leakage current blocking layer is spaced apart from one or more adjacent leakage current blocking layers.

2. The thin film transistor array substrate of claim 1, wherein the leakage current blocking layer is disposed along a side circumference of the PIN layer.

3. The thin film transistor array substrate of claim 1, wherein the leakage current blocking layer does not contact the lower electrode.

4. The thin film transistor array substrate of claim 1, wherein the leakage current blocking layer contacts the lower electrode.

5. The thin film transistor array substrate of claim 1, wherein the leakage current blocking layer does not contact the upper electrode.

6. The thin film transistor array substrate of claim 1, wherein the leakage current blocking layer is made of different material from material of the upper electrode.

7. The thin film transistor array substrate of claim 1, wherein a first side of the leakage current blocking layer contacts the PIN layer and a second side of the leakage current blocking layer contacts an insulating layer.

8. A thin film transistor array substrate for a digital X-ray detector device, comprising:
a base substrate;
a thin film transistor disposed over the base substrate;
a PIN (P type semiconductor-Intrinsic type semiconductor-N type semiconductor) diode configured to be connected to the thin film transistor, the PIN diode including a lower electrode, a PIN layer, and an upper electrode; and
a leakage current blocking layer configured to cover a side surface of the PIN layer and contact the PIN layer,
wherein the leakage current blocking layer includes metal.

9. The thin film transistor array substrate of claim 8, wherein the metal includes at least one of MoTi, Cu, and indium tin oxide (ITO).

10. A digital X-ray detector device, comprising:
a base substrate;
a thin film transistor disposed over the base substrate;
a PIN (P type semiconductor-Intrinsic type semiconductor-N type semiconductor) diode configured to be connected to the thin film transistor, the PIN diode including a lower electrode, a PIN layer, and an upper electrode; and
a leakage current blocking layer configured to cover a side surface of the PIN layer and contact the PIN layer;
an insulating layer covering the side surface of the leakage current blocking layer; and
a scintillator layer disposed over the PIN layer,
wherein the leakage current blocking layer is disposed between the PIN layer and the insulating layer and the leakage current blocking layer is made of material that is different from material that the insulating layer is made of, and the leakage current blocking layer is made of material not including silicon, and
wherein the leakage current blocking layer does not contact the upper electrode.

11. The digital X-ray detector device of claim 10, wherein the leakage current blocking layer is spaced apart from one or more adjacent leakage current blocking layers.

12. The digital X-ray detector device of claim 10, wherein the leakage current blocking layer is disposed along a side circumferences of the PIN layer.

13. The digital X-ray detector device of claim 10, wherein the leakage current blocking layer does not contact the lower electrode.

14. The digital X-ray detector device of claim 10, wherein the leakage current blocking layer contacts the lower electrode.

15. The digital X-ray detector device of claim 10, wherein the leakage current blocking layer is made of different material from material of the upper electrode.

16. A digital X-ray detector device, comprising:
a base substrate;
a thin film transistor disposed over the base substrate;
a PIN (P type semiconductor-Intrinsic type semiconductor-N type semiconductor) diode configured to be connected to the thin film transistor, the PIN diode including a lower electrode, a PIN layer, and an upper electrode;
a leakage current blocking layer configured to cover a side surface of the PIN layer and contact the PIN layer; and
a scintillator layer disposed over the PIN layer,
wherein the leakage current blocking layer includes metal.

17. The digital X-ray detector device of claim 16, wherein the metal includes at least one of MoTi, Cu, and indium tin oxide (ITO).

* * * * *